(12) United States Patent
Bu et al.

(10) Patent No.: US 10,177,473 B2
(45) Date of Patent: Jan. 8, 2019

(54) CARD EDGE CONNECTOR WITH A LATCHING STRUCTURE

(71) Applicant: FOXCONN INTERCONNECT TECHNOLOGY LIMITED, Grand Cayman (KY)

(72) Inventors: Xue-Wu Bu, Kunshan (CN); Wen-Jun Tang, Kunshan (CN); Zhuang-Xing Li, Kunshan (CN); Jian Zhang, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/914,985

(22) Filed: Mar. 7, 2018

(65) Prior Publication Data

US 2018/0261937 A1    Sep. 13, 2018

(30) Foreign Application Priority Data

Mar. 7, 2017    (CN) ...................... 2017 2 0217523 U (51) Int. Cl.
| | |
|---|---|
| *H01R 13/62* | (2006.01) |
| *H01R 12/70* | (2011.01) |
| *G06F 1/18* | (2006.01) |
| *H01R 12/72* | (2011.01) |

(52) U.S. Cl.
CPC ........... *H01R 12/7029* (2013.01); *G06F 1/18* (2013.01); *H01R 12/721* (2013.01)

(58) Field of Classification Search
CPC .................................................. H01R 13/6335

USPC ................................................... 439/160, 157
See application file for complete search history.

(56) References Cited

U.S. PATENT DOCUMENTS

| 6,916,190 B2 * | 7/2005 | Joist ...................... H05K 7/1409 361/732 |
| 7,252,623 B2 * | 8/2007 | Meyer .................... B60W 10/06 477/107 |
| 7,484,354 B2 * | 2/2009 | Stretton .................... F02C 7/32 60/226.1 |
| 7,677,907 B2 * | 3/2010 | Guan .................. H01R 12/7029 439/157 |

(Continued)

FOREIGN PATENT DOCUMENTS

CN        204243352 U        4/2015

*Primary Examiner* — Phuong Dinh
(74) *Attorney, Agent, or Firm* — Wei Te Chung; Ming Chieh Chang (57) ABSTRACT

A card edge connector includes an insulative housing along a longitudinal direction, a number of terminals fixed in the insulative housing and an ejector pivotally mounted to the insulative housing. The insulative housing has two side walls and a number of tower-shaped portions protruding upwardly from the side walls. The insulative housing has a central slot between two side walls. The tower-shaped portion has a mounting slot. The tower-shaped portion defines a holding recess communicated to the mounting slot. The ejector has a main portion and a number of holding portions protruding from two opposite sides of the main portion. The holding portion has a first portion and a second portion extending from the first portion. The first portion is closer to the central slot than the second portion. The first portion has a front edge with a sleek section.

3 Claims, 10 Drawing Sheets

(56) References Cited

U.S. PATENT DOCUMENTS

| | | | | |
|---|---|---|---|---|
| 7,922,506 B1 * | 4/2011 | Harlan | ............... | H01R 12/7005 |
| | | | | 439/160 |
| 7,938,658 B1 * | 5/2011 | Zeng | ................. | H01R 12/7029 |
| | | | | 439/160 |
| 9,261,921 B2 | 2/2016 | Hon Hai | | |

* cited by examiner

CARD EDGE CONNECTOR WITH A LATCHING STRUCTURE

FIELD OF THE DISCLOSURE

The invention is related to a card edge connector, and particularly to a latch structure of the card edge connector.

DESCRIPTION OF RELATED ARTS

Chinese Utility Patent No. 204243352U discloses a card edge connector including an insulative housing, a plurality of terminals received in the insulative housing and an ejector. The insulative housing includes a longitudinal body and two tower-shaped portions located at two opposite ends of the body. The tower-shaped portion is perpendicular to the body. The body defines a slot extending to the tower-shaped portion. The terminals are arranged at two side walls of the slot and each of which includes a contact portion extending into the slot. The ejector includes a long arm mounted in the tower-shaped portion and an operating head. The ejector rotates outward around the tower-shaped portion when an external force is working on the operating head. The long arm has a protrusion latched in the tower-shaped portion when the ejector rotates to the tower-shaped portion after a card module is inserted therein. The protrusion prevents the ejector detaching from the card module in an improper situation. The protrusion includes a first portion and a second portion. The first portion is closer to the slot than the second portion. The first portion is essentially of a triangular configuration with an apex and a relatively sharp front edge thereof. Therefore, an abrasion will be produced when the protrusion is latched to the tower-shaped portion.

Therefore, it is desired to provide a new card edge connector.

SUMMARY OF THE DISCLOSURE

To achieve the above desire, a card edge connector includes a longitudinal insulative housing, a plurality of terminals fixed in the insulative housing and an ejector pivotally mounted to the insulative housing. The insulative housing has two side walls and a plurality of tower-shaped portions protruding upwardly from the side walls. The insulative housing has a central slot between two side walls. The tower-shaped portion has a mounting slot. The tower-shaped portion defines a holding recess connected to the mounting slot. The ejector has a main portion and a plurality of holding portions protruding from two opposite sides of the main portion. The holding portion has a first portion and a second portion extending from the first portion. The first portion is closer to the central slot than the second portion. The first portion has a front edge with a sleek starting section.

DETAILED DESCRIPTION OF THE PREFERRED EMBODIMENT

Figure 1:
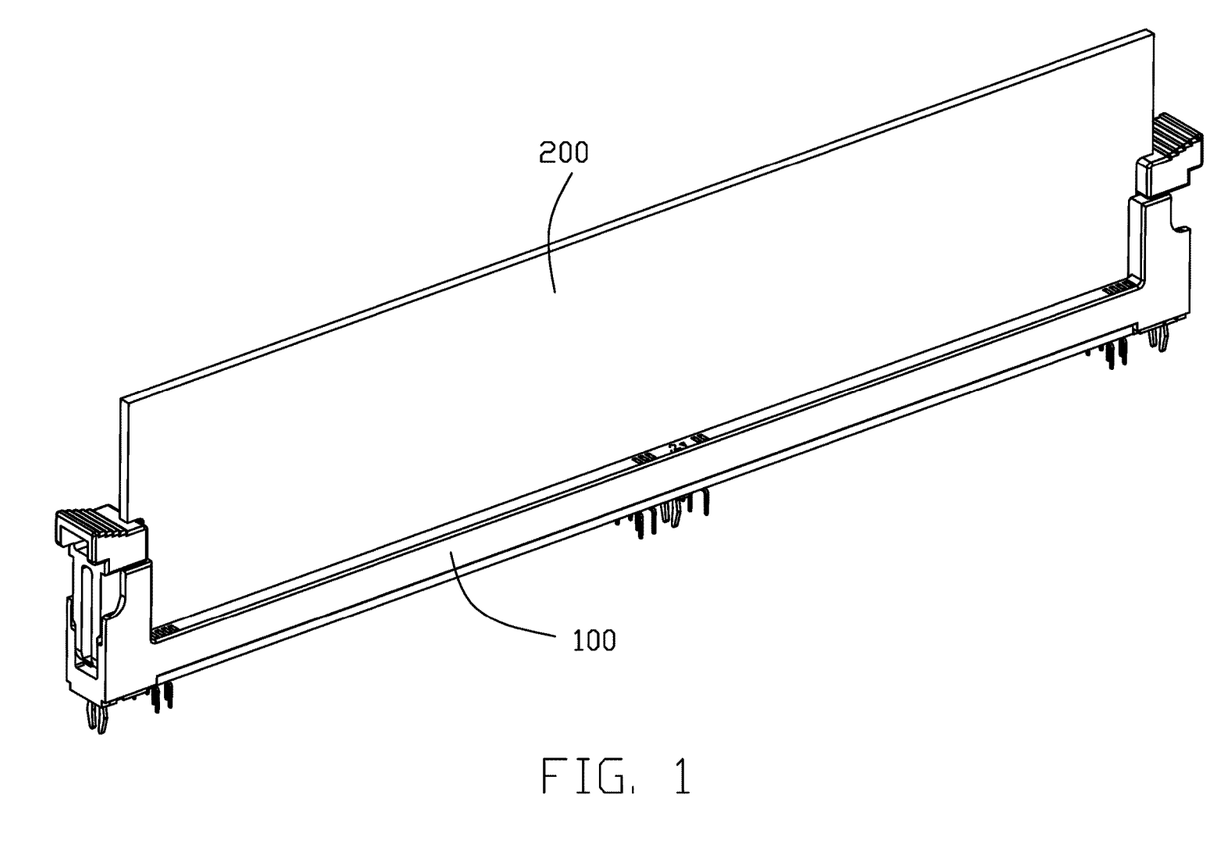
FIG. 1 is a perspective view of a card edge connector assembled with a card according to the invention.
Figure 2:
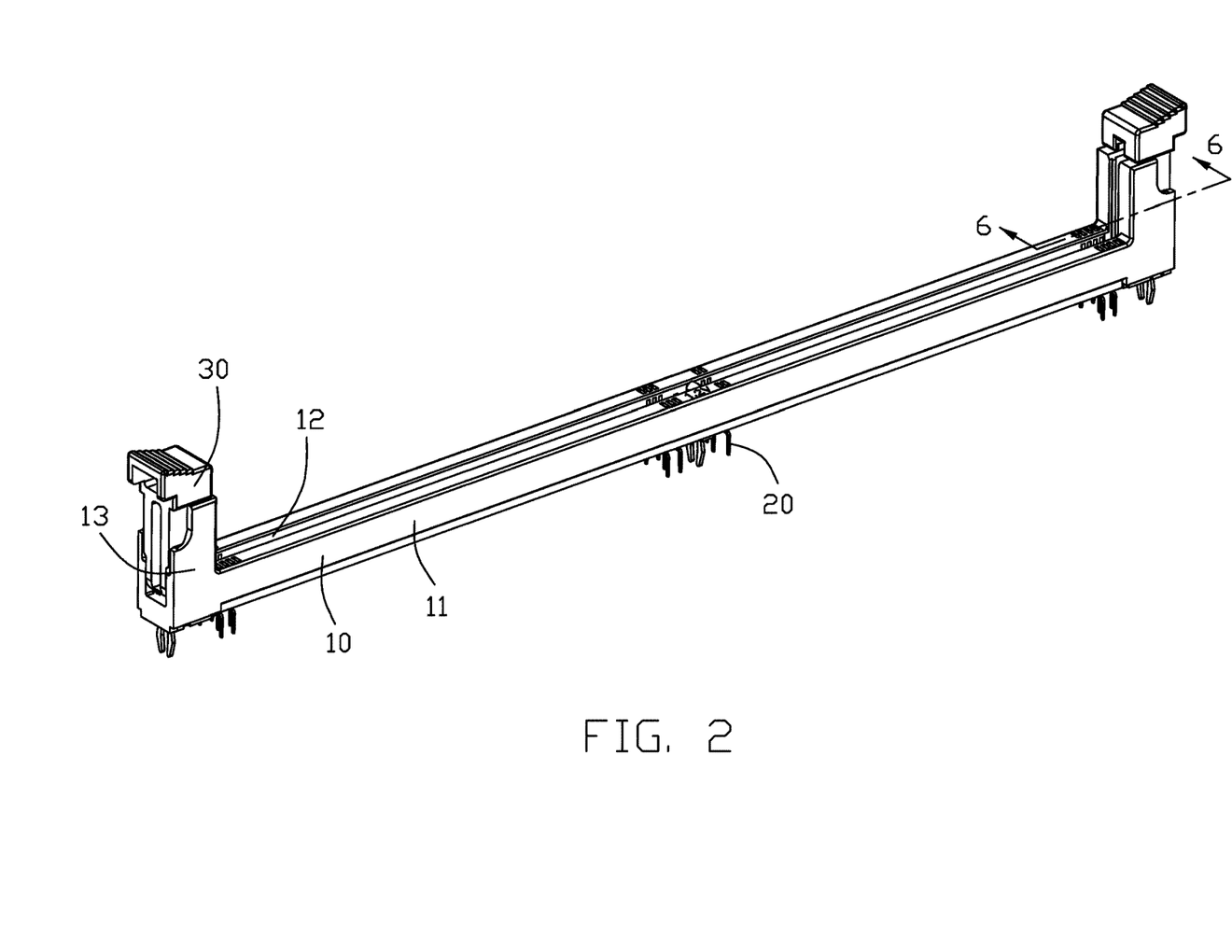
FIG. 2 is a perspective view of the card edge connector of FIG. 1.
Figure 3:
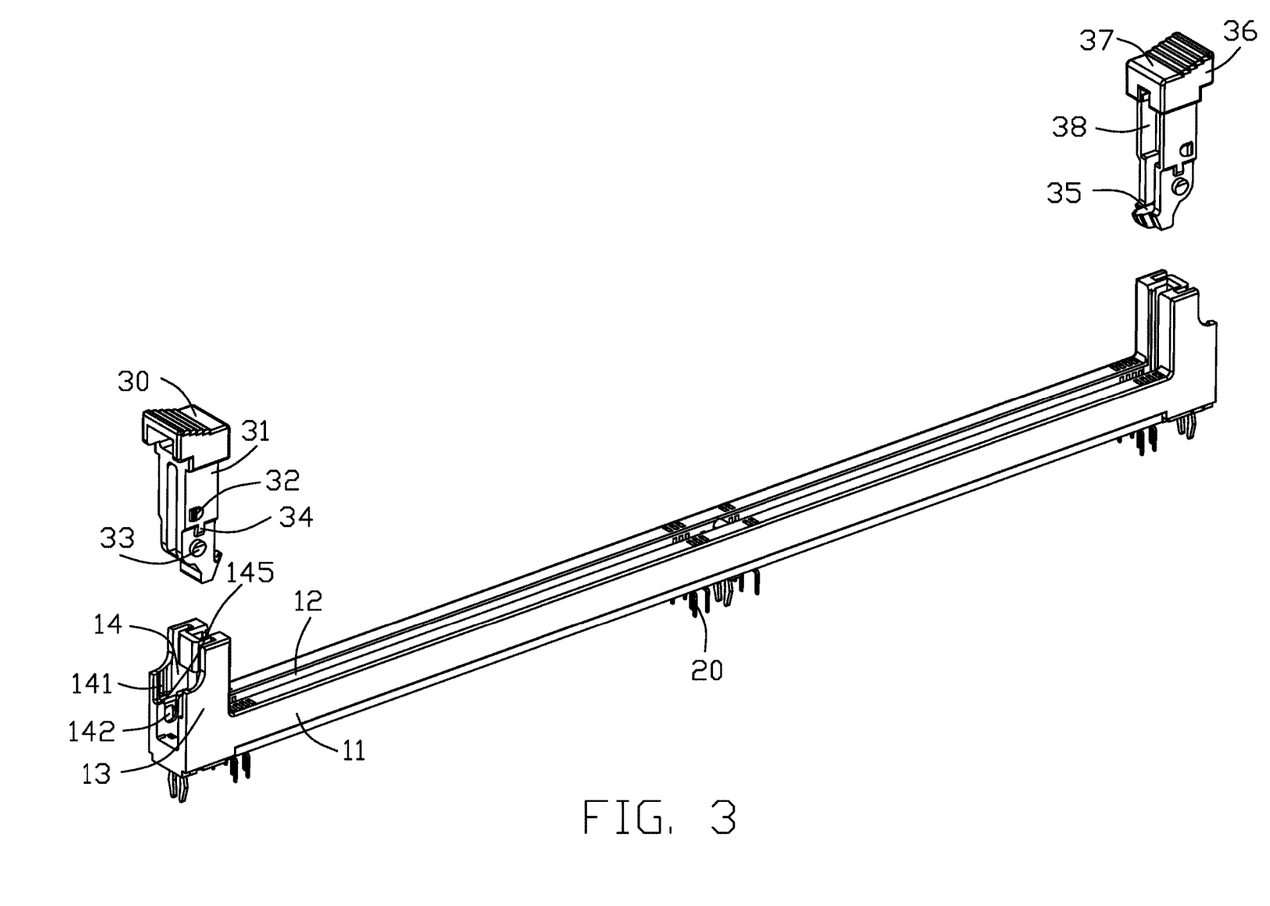
FIG. 3 is an exploded perspective view of the card edge connector of FIG. 2.
Figure 4:
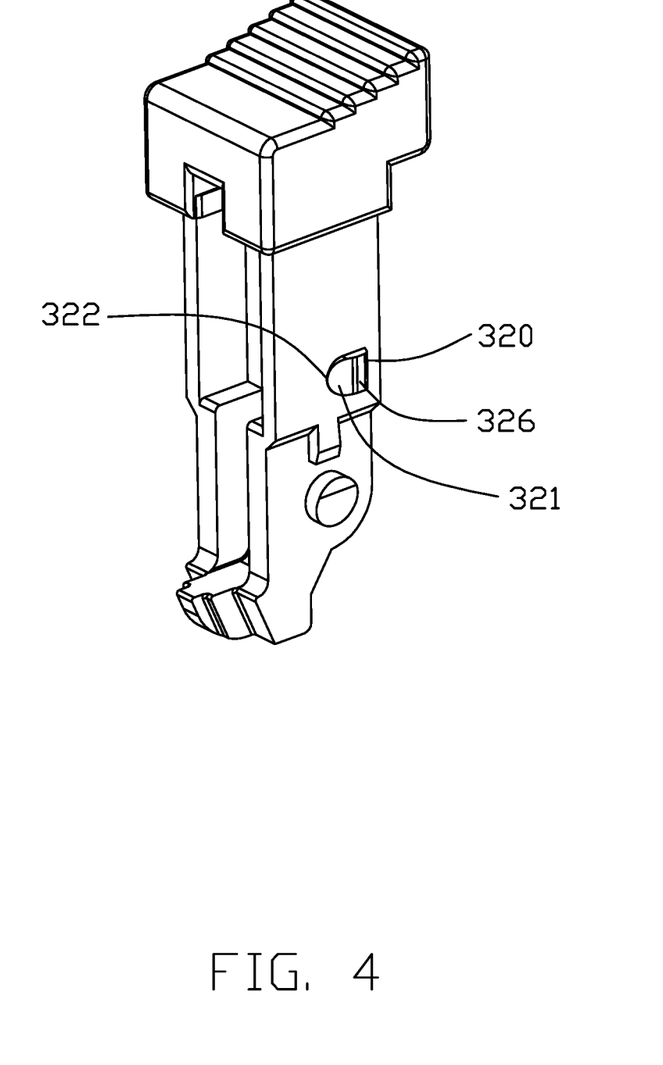
FIG. 4 is a perspective view of an ejector of FIG. 3.
Figure 5:
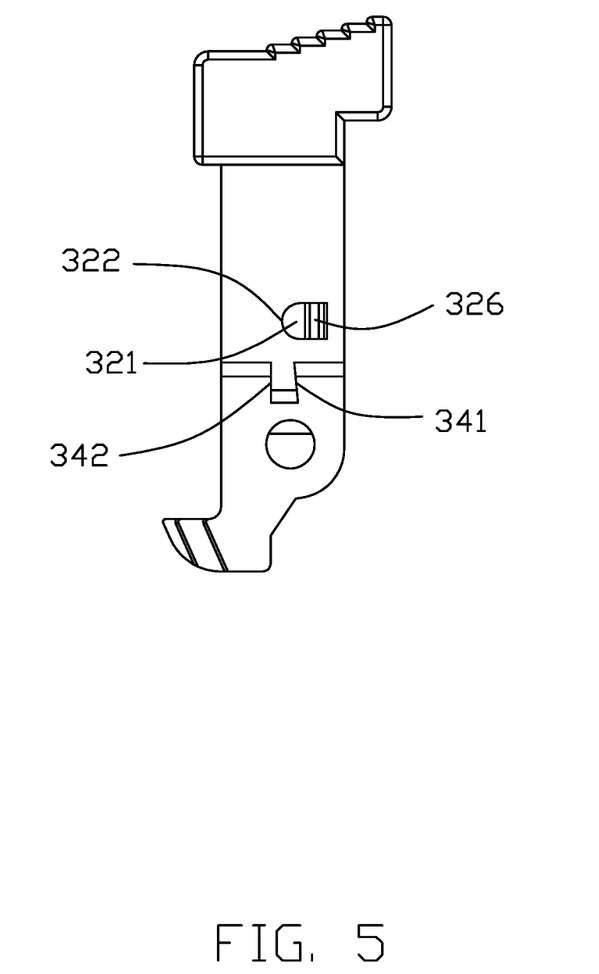
FIG. 5 is a front view of the ejector of FIG. 4.
Figure 6:
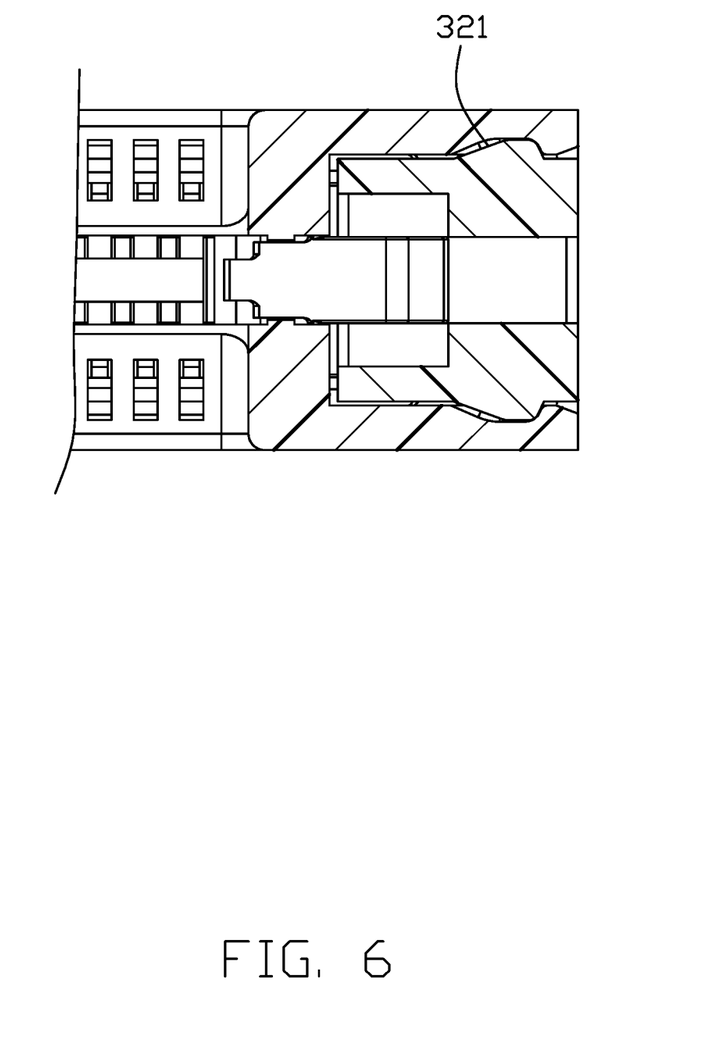
FIG. 6 is a cross-sectional view of the card edge connector of FIG. 2 taken along line 6-6 thereof.
Figure 7:
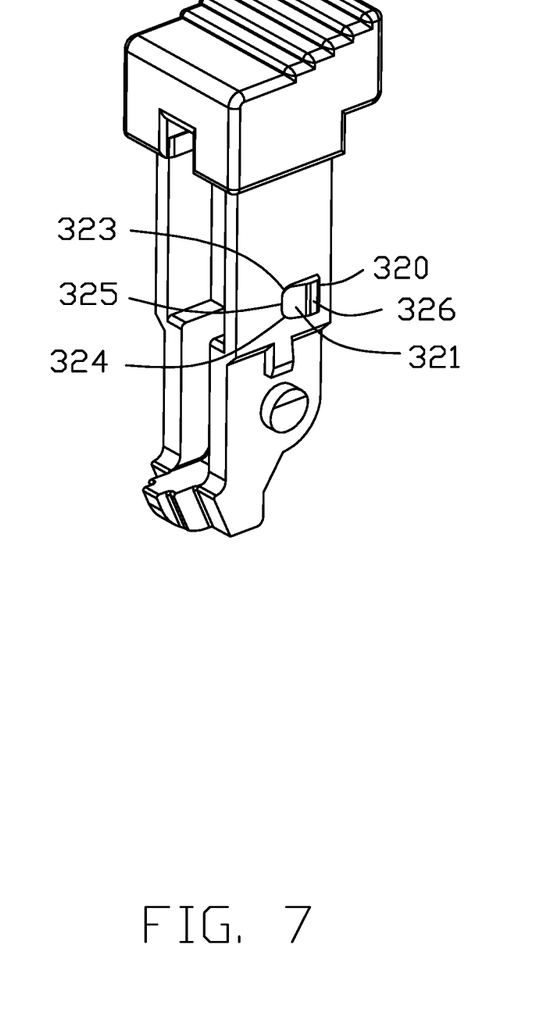
FIG. 7 is another embodiment of an ejector of FIG. 3.
Figure 8:
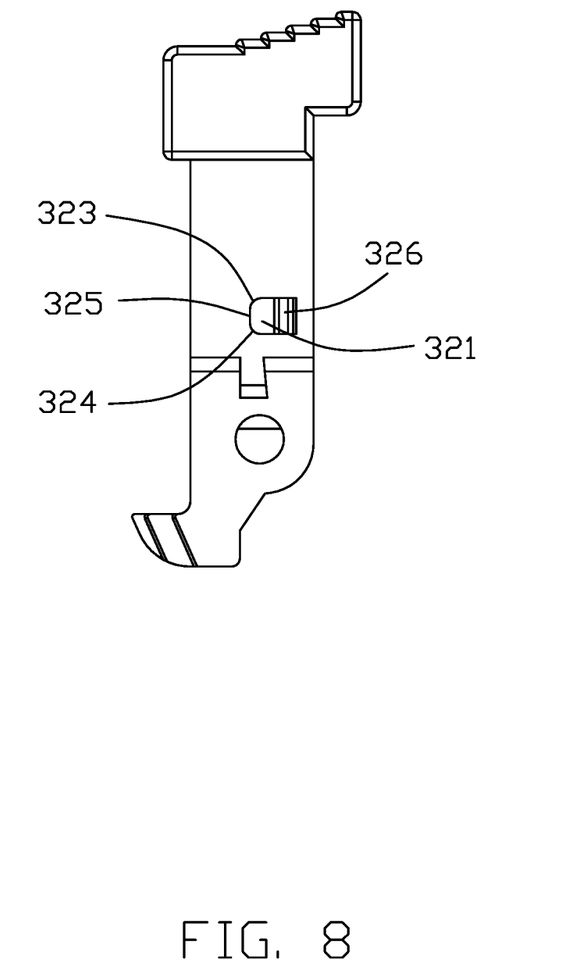
FIG. 8 is a front view of the ejector of FIG. 7.

Reference will now be made in detail to the embodiments of the present disclosure. Referring to FIGS. 1-3, a card edge connector 100 is used for electrically connecting a card module 200 and a mother board (not shown). The card edge connector 100 includes an insulative housing 10, a plurality of terminals 20 fixed in the insulative housing 10 and an ejector 30 pivotally mounted to the insulative housing 10.

The insulative housing 10 includes two side walls 11 extending along a longitudinal direction and two tower-shaped portions 13 protruding upwardly from two opposite ends of the side walls 11, respectively. The insulative housing 10 includes a central slot 12 defined between the side walls 11 to receive the card module 200. Each of the tower-shaped portions 13 includes a mounting slot 14 to receive the corresponding ejector 30. The ejector 30 is pivotally mounted in the mounting slot 14. The ejector 30 includes a main portion 31 and two holding portions 32 each protruding from two opposite sides of the main portion 31, respectively. The holding portion 32 is parallel to the side wall 11 and gradually becomes thick from the inside to the outside. The holding portion 32 has an arc starting edge. The tower-shaped portion 13 defines a holding recess 141 communicated to the mounting slot 14 in a transverse direction perpendicular to the longitudinal direction for adapting to the holding portion 32. The ejector 30 is locked to the insulative housing 10 by the holding portion 32. The ejector 30 includes two pivot shaft portions 33 each protruding from two opposite sides of the main portion 31, respectively. The shaft portion 33 is pivotally mounted to the insulative housing 10. The ejector 30 includes a supporting portion 35 extending inwardly from a bottom side of the main portion 31. The ejector 30 includes an operating portion 36 extending outwardly from a top side of the main portion 31 and a meeting portion 37 extending inwardly from the operating portion 36 and beyond the main portion 31. The tower-shaped portion 13 defines a pivoting hole 142 communicated to the mounting slot 14 to receive the corresponding pivot shaft portions 33 of the ejector 30. When the operating portion 36 is forced, the ejector 30 rotates around the insulative housing 10 to be in an opening state or in a locking state. When the operating portion 36 is forced outwardly, the meeting portion 37 moves outward to release the card module 200 in an opening state. When the operating portion 36 is forced inwardly, the meeting portion 37 moves toward the central slot 12 to lock the card module 200 in a locking state. The main portion 31 includes a protrusion 34 above the shaft portion 33. The protrusion 34 prevents the ejector 30 from rotating outward overly. In the longitudinal direction, the ejector 30 has an stepped opening slot 38.

Referring to FIGS. 4-8, in the longitudinal direction, the holding portion 32 performs a gradually thickening trend relative to the main portion 31. The holding portion 32 is shaped as a wedge which leads to a gradually increasing interference between the holding portion 32 and the tower-shaped portion 13. It is beneficial to lock the holding portion 32 to the tower-shaped portion 13 smoothly, and reduces an abrasion between the holding portion 32 and the tower-shaped portion 13. The holding portion 32 is easily manufactured in a molding process. The holding portion 32 includes a first portion or tapered section 321 and a second portion or planar protruding section 326 extending from the first portion 321. The first portion 321 is closer to the central slot 12 than the second portion 326. The first portion 321 has a front edge with a sleek section 322. As shown in the different embodiments, the first portion 321 has two different structures of the front edge as following: (1) the front edge of the holding portion 32 is shaped as a semicircle (Referring to FIGS. 4-5); (2) the front edge of the holding portion 32 includes a first sleek section 323, a second sleek section 324 and a straight section 325 connecting the first sleek section 323 and the second sleek section 324 (Referring to FIGS. 7-8), the straight section 325 is closer to the central slot 12 than the first sleek section 323 and the second sleek section 324. The first sleek section 323 is symmetrical to the second sleek section 324. Anyhow, in both two embodiments, the front edge of the first portion 321 of the holding portion 32 has at least one curved configuration, either at the central region or the two opposite regions. When the ejector 30 mates with the tower-shaped portion 13, the first portion 321 of the holding portion 32 slides into the holding recess 141 of the mounting slot 14. The sleek section 322/323/324 of the first portion 321 reduces an abrasion of the holding portion 32. The holding portion 32 includes a guiding surface 320 located at an end of the second portion 326. When the ejector 30 moves to the opening state, the guiding surface 320 helps the holding portion 32 to be detached from the holding recess 141.

Figure 9A:
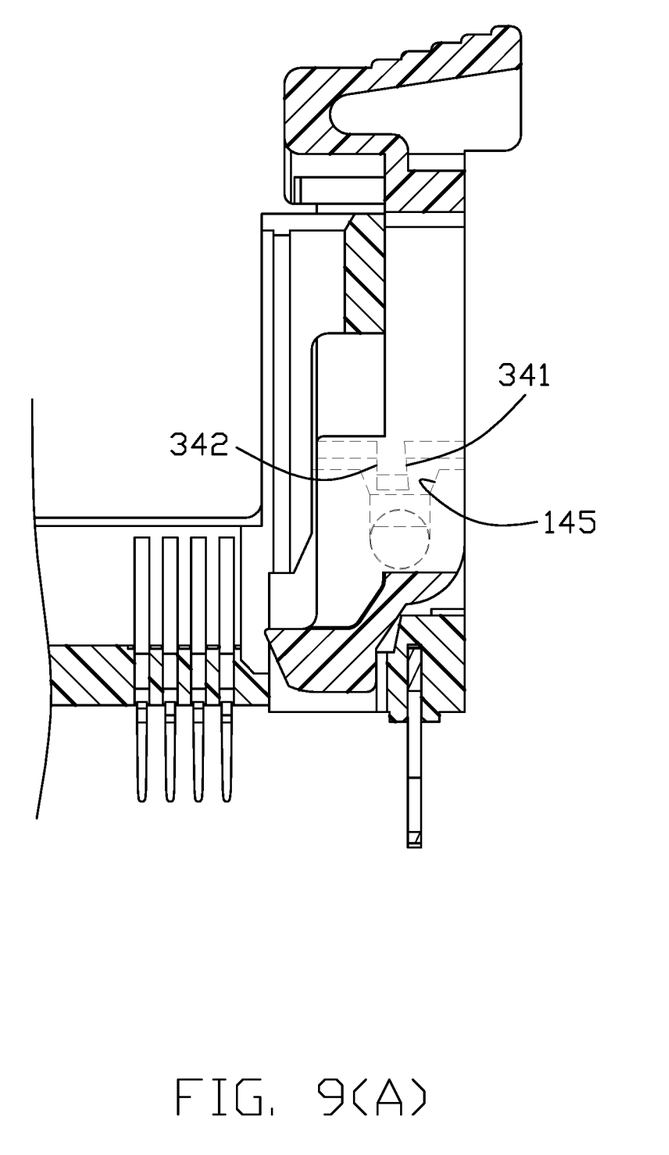
FIG. 9(A) is a partial cross-sectional view of the card edge connector of FIG. 1 when the ejector is in a closed position.
Figure 9B:
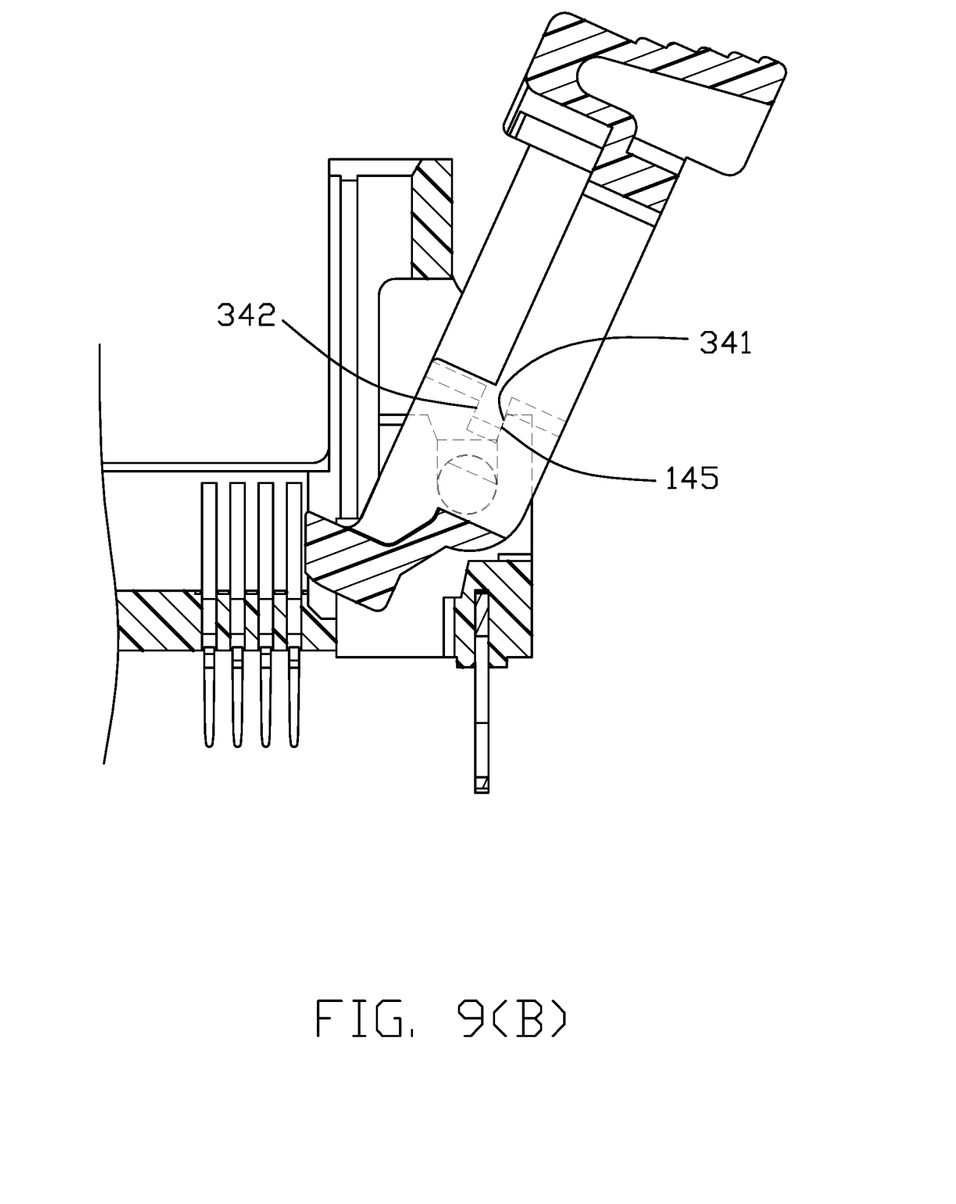
FIG. 9(B) is another partial cross-sectional view of the card edge connector of FIG. 1 when the ejector is in an open position.

Notably, as shown in U.S. Pat. No. 6,113,404, in the first generation traditional design, the corresponding first portion is essentially of a typical wedge-like configuration for easy inward moving during locking the module. Anyhow because the ejector is rotatable with regard to the tower portion, such a typical wedge-like configuration is not fully compliant therewith. Therefore, in a later time, the tapered section/first portion, which is tapered toward the central slot when measured in a transverse direction, is modified to be of the triangular shape in compliance with the rotation path, as shown in the aforementioned Chinese Utility Patent No. 204243352U treated as the second generation traditional design. Notably, in the instant invention, i.e., the third generation design, the first portion/tapered section is configured with a form between the first generation and the second generation for achieving a compromise between easy rotation and less abrasion wherein the front edge of the tapered section forms at least a curved configuration, i.e., the sleek sections 322, 323 and 324 in a side view. Another feature of the invention is related to the protrusion 34 which is closely located above the corresponding shaft portion 33 and abuts against the inclined step 145 on the corresponding side of the main portion 31 when the ejector 30 is rotated to the outer/open position for preventing excessive rotation of the ejector 30 with regard to the housing 10. Notably, to comply with the configuration of the inclined step 145 during abutment, the outer edge 341 of the protrusion 34 also extends in an oblique direction, compared with the inner edge.342 which extends in a perpendicular direction when the ejector 30 is disposed in a locking upstanding position.

While a preferred embodiment according to the present disclosure has been shown and described, equivalent modifications and changes known to persons skilled in the art according to the spirit of the present disclosure are considered within the scope of the present disclosure as described in the appended claims.

What is claimed is:

1. A card edge connector comprising:

an insulative housing having two side walls extending along a longitudinal direction and two tower-shaped portions protruding upwardly from two opposite ends of the insulative housing, a central slot defined between two side walls, each of the tower-shaped portions defining a mounting slot and a holding recess communicating with the mounting slot in a transverse direction perpendicular to said longitudinal direction;

a plurality of terminals fixed in the insulative housing;

a pair of ejectors respectively mounted in the corresponding mounting slots, each of the ejectors having a main portion and a pair of holding portions protruding from two opposite sides of the main portion, respectively, wherein the holding portion has a first portion and a second portion extending from the first portion, and the first portion is closer to the central slot than the second portion, and the first portion has a front edge with a sleek section, wherein the front edge of the first portion has a first sleek section, a second sleek section and a straight section connecting the first sleek section and the second sleek section, and the straight section is closer to the central slot than the first sleek section and the second sleek section, wherein the first sleek section is symmetrical to the second sleek section, wherein the holding portion is shaped as a wedge, wherein the holding portion has a guiding surface located at an end of the second portion, wherein the ejector has a stepped opening slot in the longitudinal direction, wherein the front edge of the holding portion is shaped as an arc edge, wherein the ejector has a supporting portion located at a bottom end of the main portion and extending toward the central slot, an operating portion and a meeting portion located at a top end of the main portion, and a plurality of shaft portions protruding from two opposite sides of the main portion, wherein the main portion has a protrusion located above the shaft portion, and the protrusion prevents the ejector from rotating outward overly.

2. A card edge connector comprising:

an insulative housing having two side walls extending along a longitudinal direction and two tower-shaped portions protruding upwardly from two opposite ends of the insulative housing, a central slot defined between two side walls, each of the tower-shaped portions defining a mounting slot and a holding recess communicating with the mounting slot in a transverse direction perpendicular to said longitudinal direction;

a plurality of terminals fixed in the insulative housing;

an ejector mounted in each mounting slot, the ejector having a main portion and a pair of holding portions protruding from two opposite sides of the main portion, respectively; wherein the holding portion has a wedge-like configuration with a front edge tapered toward the central slot when measured in the transverse direction, and a portion of said front edge defines at least a curved configuration in a side view, wherein the curved configuration is formed at a middle region of the front edge, wherein there are two of said curved configuration formed on upper and lower position of the front edge, wherein each of said ejector includes a pivot shaft portion and a protrusion on each side of said main portion below the holding portion, wherein one each side of the main portion of the ejector, the corresponding protrusion is located between the corresponding holding portion and the pivot shaft portion in a vertical direction perpendicular to both the longitudinal direction and the transverse direction.

3. A card edge connector comprising:

an insulative housing having two side walls extending along a longitudinal direction and two tower-shaped portions protruding upwardly from two opposite ends of the insulative housing, a central slot defined between two side walls, each of the tower-shaped portions defining a mounting slot and a holding recess communicating with each mounting slot in a transverse direction perpendicular to said longitudinal direction;

a plurality of terminals fixed in the insulative housing; and an ejector mounted in the mounting slot, the ejector having a main portion with two opposite sides in the transverse direction; wherein on each of said sides, the main portion has a holding portion cooperatively received within a recess in the tower portion to lock the ejector in an inner closed position, a pivot shaft portion to be received within a pivot hole in the tower portion, and a protrusion located between the holding portion and the shaft portion in a vertical direction perpendicular to both said longitudinal direction and the transverse direction to abut against a step of the tower portion for preventing excessive outward rotation of the ejector when the ejector is moved to an outer open position opposite to the inner closed position, wherein the step of the tower portion extends obliquely, and the protrusion forms an outer edge extends in an inclined direction when the ejector is in an locked upstanding position, so as to have the outer edge compliant with the step when the ejector is moved to the outer open position, wherein the holding portion has a wedge-like configuration with a front edge tapered toward the central slot when measured in the transverse direction, wherein each front edge has at least a curved configuration, wherein said curved configuration is located at a middle region of the front edge.

* * * * *